United States Patent
Delaporte

(10) Patent No.: US 12,086,337 B2
(45) Date of Patent: Sep. 10, 2024

(54) ELECTROMECHANICAL SLIP RING CONFIGURATIONS FOR A FOLDABLE DISPLAY DEVICE

(71) Applicant: Lepton Computing LLC, Brooklyn, NY (US)

(72) Inventor: Stephen E. Delaporte, New York, NY (US)

(73) Assignee: LEPTON COMPUTING LLC, Brooklyn, NY (US)

( * ) Notice: Subject to any disclaimer, the term of this patent is extended or adjusted under 35 U.S.C. 154(b) by 0 days.

(21) Appl. No.: 18/374,155

(22) Filed: Sep. 28, 2023

(65) Prior Publication Data

US 2024/0019949 A1    Jan. 18, 2024

Related U.S. Application Data

(63) Continuation of application No. 17/567,125, filed on Jan. 1, 2022, now Pat. No. 11,809,647.

(60) Provisional application No. 63/133,292, filed on Jan. 1, 2021.

(51) Int. Cl.
  *G06F 3/041* (2006.01)
  *G06F 1/16* (2006.01)
  *H05K 5/02* (2006.01)

(52) U.S. Cl.
  CPC ............ *G06F 3/041* (2013.01); *G06F 1/1641* (2013.01); *G06F 1/1681* (2013.01); *H05K 5/0226* (2013.01); *G06F 2203/04102* (2013.01)

(58) Field of Classification Search
  CPC ...... G06F 3/041; G06F 1/1641; G06F 1/1681; G06F 2203/04102; G06F 1/1616; H05K 5/0226; G09F 9/301
  See application file for complete search history.

(56) References Cited

U.S. PATENT DOCUMENTS

| | | | | |
|---|---|---|---|---|
| 8,959,716 | B2* | 2/2015 | Hsu | .......................... E05D 11/08 16/302 |
| 11,809,647 | B2* | 11/2023 | Delaporte | ............. G06F 1/1641 |
| 2022/0179460 | A1* | 6/2022 | Delaporte | ............. G06F 1/1652 |

(Continued)

*Primary Examiner* — Lisa Lea-Edmonds
(74) *Attorney, Agent, or Firm* — ArentFox Schiff LLP; Joseph M. Maraia

(57) ABSTRACT

A foldable touch screen display device made up of flexible segments that can be folded from a compact state to an expanded state which also includes electromechanical slip rings. The form factor of the compact state is roughly the size of a typical handheld phone or smaller. The form factor of the expanded state is roughly the size of a larger phone or tablet computer, which may also have the size and mechanical functionality of a laptop. The device form factor may also be a flip phone configuration. Both folded states may include an integrated speaker and microphone. The electromechanical slip rings are utilized to provide multiple electrical connections between the device's display segments and their respective support structures. The device may further include sensors to indicate the position of each display segment. In one embodiment, a module attached to, situated within, or otherwise associated with at least one segment of the flexible display or rigid display may contain all or substantially all processing and memory, along with a communications system, which may be used in any folded state.

20 Claims, 4 Drawing Sheets

(56) References Cited

U.S. PATENT DOCUMENTS

| | | | |
|---|---|---|---|
| 2022/0187877 A1* | 6/2022 | Delaporte | G06F 1/1681 |
| 2022/0197427 A1* | 6/2022 | Delaporte | G06F 3/0412 |
| 2022/0214756 A1* | 7/2022 | Delaporte | G06F 3/041 |
| 2024/0019949 A1* | 1/2024 | Delaporte | H05K 5/0226 |

* cited by examiner

ELECTROMECHANICAL SLIP RING CONFIGURATIONS FOR A FOLDABLE DISPLAY DEVICE

CROSS REFERENCE TO RELATED APPLICATIONS

This application is a continuation of U.S. patent application Ser. No. 17/567,125, filed on Jan. 1, 2022, entitled "Electromechanical Slip Rings For A Foldable Display Device" which claims priority to and the benefit of claims the benefit of U.S. Provisional Patent Application No. 63/133,292, filed on Jan. 1, 2021, which is incorporated in its entirety herein by reference.

FIELD OF THE INVENTION

The present invention relates generally to computing devices, and more particularly, to a computing device with a touch screen display that can be folded from a compact state to an expanded state.

BACKGROUND OF THE INVENTION

The use of handheld computing devices today has been significantly enabled by a number of advancements in electronics, including the miniaturization of components, an increase in processing speeds, improved memory capacity, and the optimization of battery efficiency. Advancements in touch screen display technology have also enabled interfaces to become more adaptable and intuitive to use on a small scale. Because of these enormous improvements over the last decade, the differences in the performance between handheld computing devices, such as mobile phones, and larger computing devices, have become increasingly subtle.

One of the great difficulties in using a small-scale touch screen device, however, is in the fact that it can often be cumbersome to physically interact with. This is especially apparent when selecting and manipulating features and inputting text, which can sometimes be imprecise for a user. In such handheld computing devices as a touch screen mobile phone, the limited size of the display can also significantly reduce the viewing capacity while watching videos, using graphic-intensive applications, and reading text. The rigid nature of a standard touch screen display can also limit the portability of a device when its form factor is in the larger size range for a phone, or at the scale of a tablet, which makes folding a desirable feature. Additionally, because a foldable device fundamentally has a hinge mechanism located between the two display segment's structural supports, it is challenging to connect the electronics from one structural support to the other. Flexible circuits are the most common method for making these electronic connections, however, over time flexible circuits can wear away and stop functioning once the device is folded enough times.

There is therefore a need for touch screen display devices that can be adjusted in size without sacrificing the convenience of being compact or handheld. There is also a need for electromechanical slip ring mechanisms to provide electrical connections between the electronics housed in the respective structural supports of a foldable device's two display segments. As the usage of foldable devices becomes more pervasive, and more apps integrate the folding of the device as part of their function, more folds per day per unit will lead to the disfunction of standard flexible circuit connections making slip rings a viable alternative solution.

SUMMARY OF EMBODIMENTS OF THE INVENTION

A foldable touch screen display device made up of flexible segments that can be folded from a compact state to an expanded state which also includes electromechanical slip rings. The form factor of the compact state is roughly the size of a typical handheld phone or smaller. The form factor of the expanded state is roughly the size of a larger phone or tablet computer, which may also have the size and mechanical functionality of a laptop. The device form factor may also be a flip phone configuration. Both folded states may include an integrated speaker and microphone. The electromechanical slip rings are utilized to provide multiple electrical connections between the device's display segments and their respective support structures. The device may further include sensors to indicate the position of each display segment. In one embodiment, a module attached to, situated within, or otherwise associated with at least one segment of the flexible display or rigid display may contain all or substantially all processing and memory, along with a communications system, which may be used in any folded state.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently.

Figure 1:
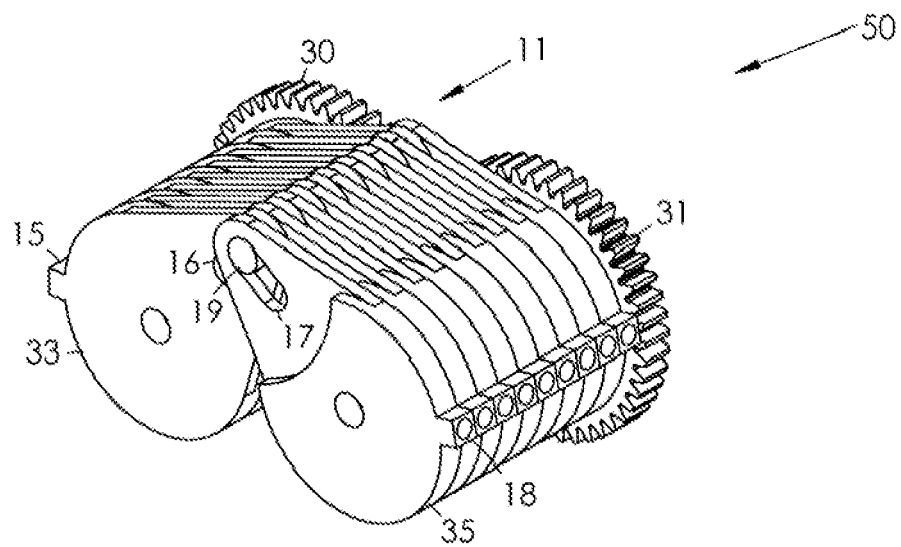
FIG. 1 is a perspective view of an electromechanical slip ring mechanism for a foldable computing device shown in two separate positions, the first position shows the device in an unfolded state, and the second position shows the device in a folded state.
Figure 1:
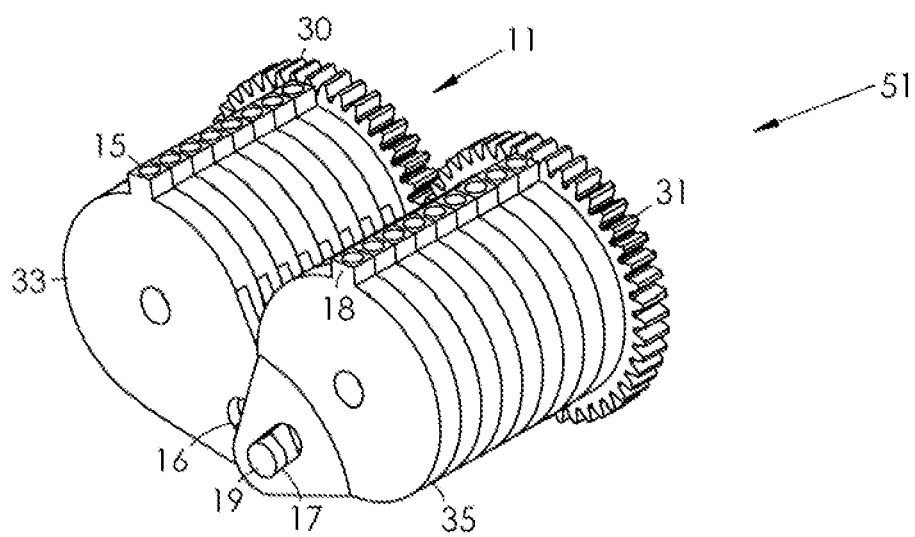

In accordance with the exemplary embodiment shown in FIG. 1, an electromechanical slip ring mechanism 11 for a foldable computing device is shown in two separate positions 50 and 51. In position 50, slip ring mechanism 11 is shown in a position that corresponds to the unfolded state of a foldable device, and below in position 51, slip ring mechanism 11 is shown in a position that corresponds to the folded state of a foldable device. In position 51, slip ring 33 is shown rotated such that its connection slot 16 is facing upward while its segment input connection 15 is positioned to be parallel with the same plane as its corresponding segment which is positioned in the unfolded state flat against the ground plane. Slip ring 33 is also concentrically connected to spur gear 30 which is driven by the movement of its corresponding segment. Similarly, slip ring 35, which is located opposite slip ring 33, is positioned such that its connection slot 17 is also facing upward while its segment input connection 18 is positioned parallel to the same plane as its corresponding segment which is positioned in the unfolded state along the ground plane. Slip ring 35 is concentrically connected to spur gear 31 which is driven by the movement of its corresponding segment. Pin 19 is utilized to provide an electromechanical connection between slip ring 33 and 35 allowing a continuous electrical connection to be made while the device is free to rotate from a folded to an unfolded state. The full electrical connection travels from segment input connection 15 through slip ring 33 to connection slot 16, and then to pin 19, to connection slot 17, to slip ring 35, and then finally to segment input connection 18. Also shown and situated behind slip rings 33 and 35 are a series of slip rings that represent multiple electrical connections. Multiple electrical connections could also be run through a single slip ring assembly with multiple slots and pins if necessary, to reduce the overall space that the connections makeup within the device. It is also important to note that the pin used to connect two slip rings could be affixed to one slip ring which would then connect and slide within a slot located on a second slip ring. This would eliminate the need for having two slots to make a single connection.

Figure 2:
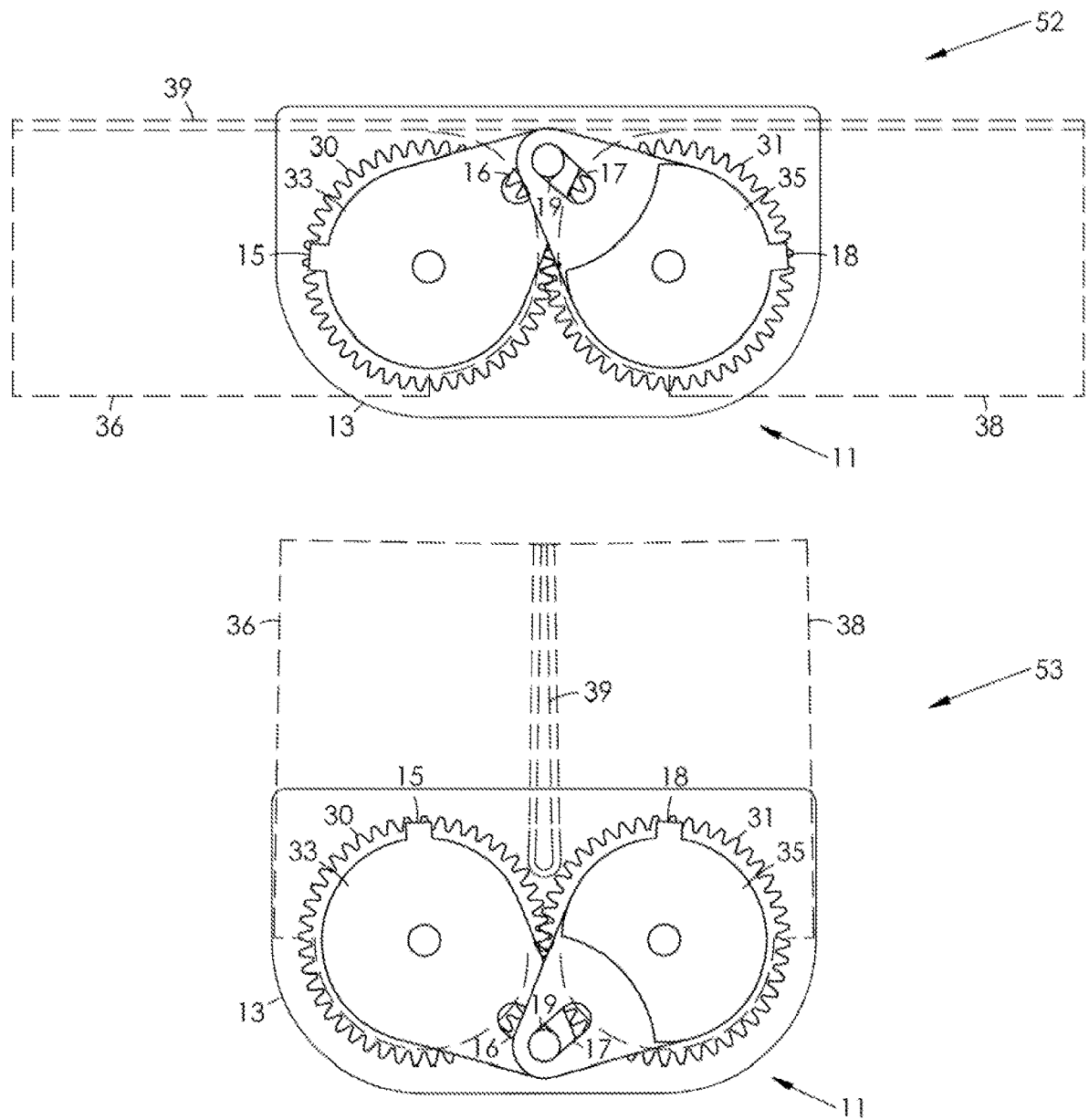
FIG. 2 is a side view showing the electromechanical slip ring mechanism from FIG. 1 with its hinge housing and sections of its two flexible display segments and their respective structural support shown in an unfolded and folded state.

In position 51, electromechanical slip ring assembly 11 is shown corresponding to a foldable device's folded state. In this case, slips rings 33 and 35 are shown pointing downward while their respective segment input connections 15 and 18, where each segment's relative electronic connections are connected through, are positioned upward such that they are parallel with each of their respective segment's structural supports as they are positioned in the folded state. This is further illustrated in FIG. 2, where segment structural support 36 is shown on the left side connected to spur gear 30 and slip ring 33, while segment structural support 38 is shown on the right side connected to spur gear 31 and slip ring 35. A flexible display 39 is shown at the top of the foldable device attached to segment structural supports 36 and 38. The hinge housing 13 is used to support the electromechanical slip ring assembly 11. It is also important to note that while the embodiments show a single flexible display with two display segments, a rigid cover display may also be included with the device, and two rigid tiled display segments may also be integrated instead of having a flexible display. The device may also have different display aspect ratios such that it takes on a flip phone form factor.

Figure 3:
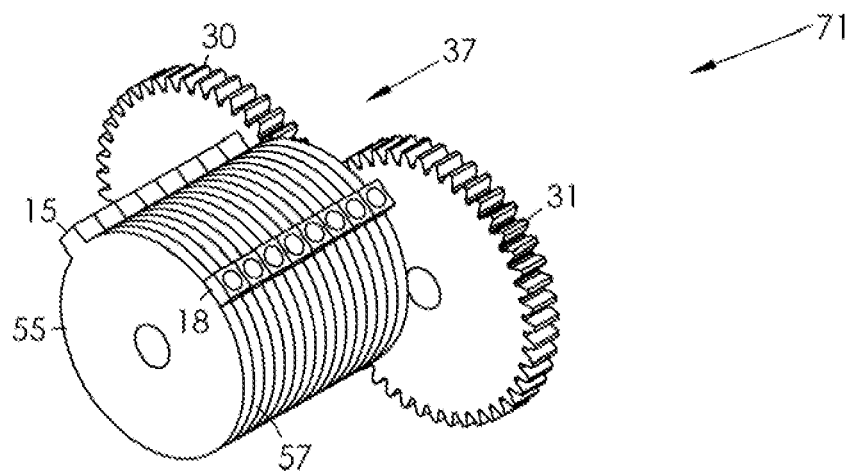
FIG. 3 is a perspective view of an electromechanical slip ring mechanism for a foldable computing device is shown in two separate positions, the first position shows the device in an unfolded state, and the second position shows the device in a folded state.
Figure 3:
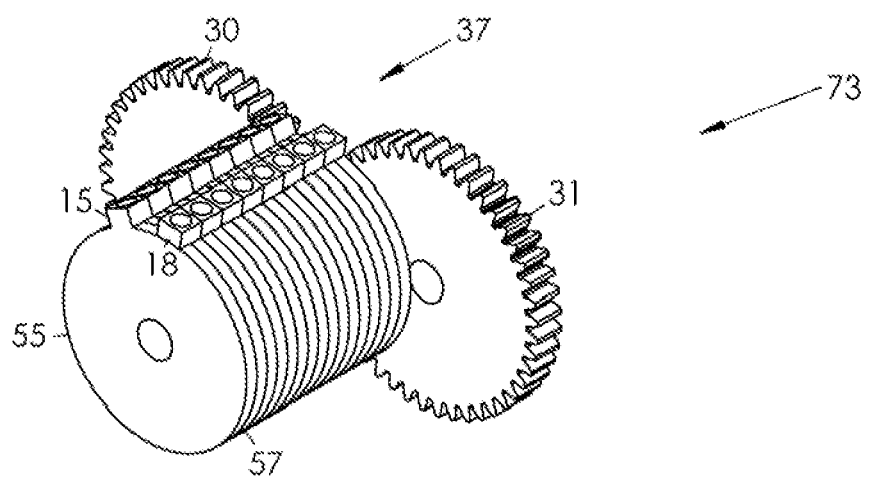
Figure 4:
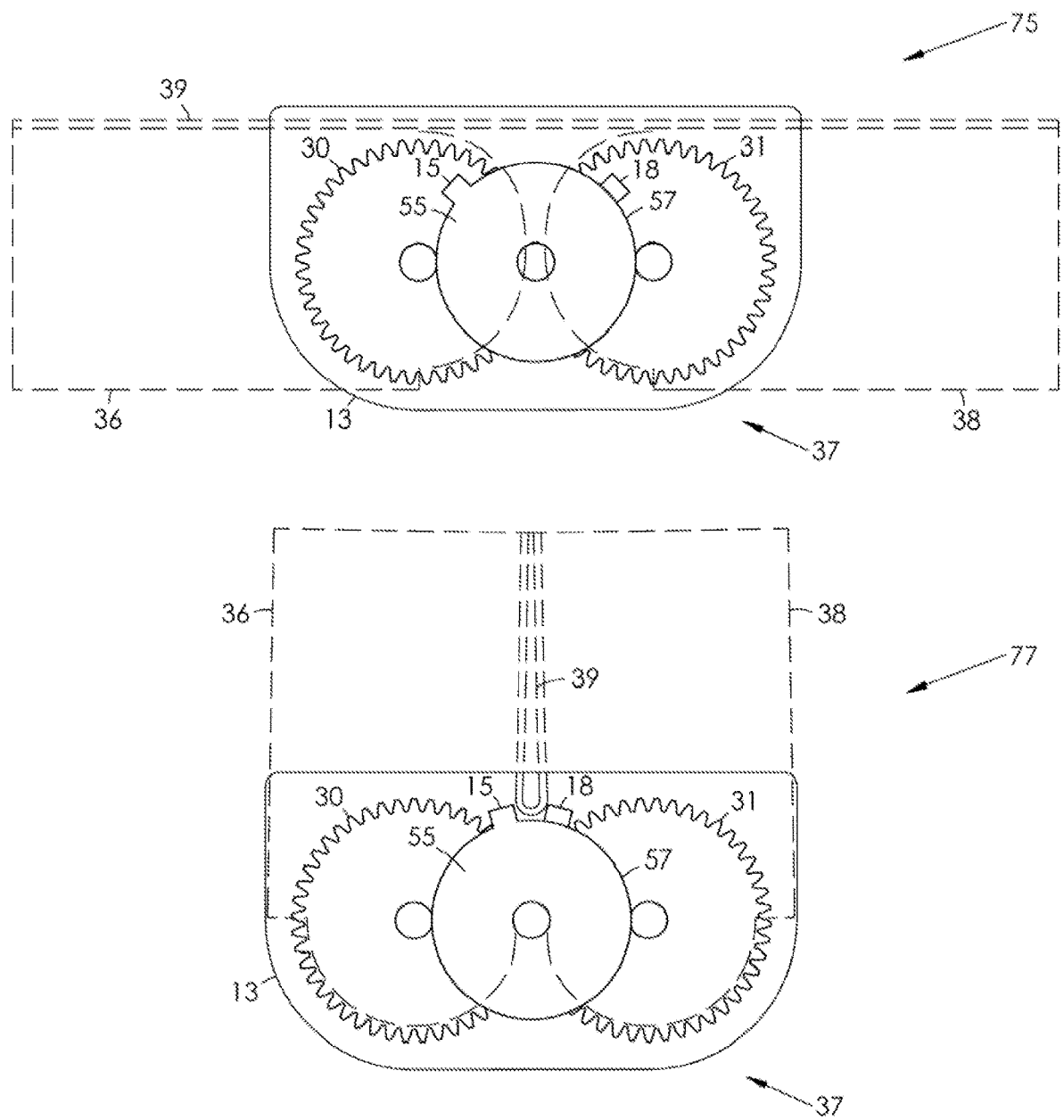
FIG. 4 is a side view showing the electromechanical slip ring mechanism from FIG. 3 with its hinge housing and sections of its two flexible display segments and their respective structural support shown in an unfolded and folded state.

Shown in FIG. 3 is an embodiment of an electromechanical slip ring assembly 37, which utilizes slips rings 55 and 57 to provide the electrical connection between the device's segment structural supports. In this embodiment, slip rings 55 and 57 are concentrically connected and utilize a more standard slip ring configuration where an electrical rotary connection is made between both slip rings such that a constant force is applied from one electrical connection to the other as the slip rings rotate in opposite directions to each other. Position 71 corresponds with a foldable device's unfolded state, while position 73 corresponds with a foldable device's folded state. Similar to the embodiment shown in FIG. 1, electromechanical slip ring assembly 37 also has segment input connections 15 and 18, which can be seen connected to segment structural supports 36 and 38 respectively from FIG. 4 in positions 75 and 77, which correspond with positions 71 and 73. These structural supports also include an attached flexible display 39. A third embodiment that could be implemented would be in having circular slip rings that are concentrically located with each gear, similar to the embodiment shown in FIG. 1, but with their electrical connections situated on their outside edges such that their connections are constantly in contact with each other as the mating slip rings rotate alongside each other.

While certain features of the invention have been illustrated and described herein, many modifications, substitutions, changes, and equivalents will now occur to those of ordinary skill in the art. It is, therefore, to be understood that the appended claims are intended to cover all such modifications and changes that fall within the true spirit of the invention.

The invention claimed is:

1. An apparatus comprising:
   (a) a flexible touch-sensitive display composed of a first flexible touch-sensitive display portion and a second flexible touch-sensitive display portion; wherein:
      (1) the first flexible touch-sensitive display portion is attached to a first structural support segment;
      (2) the second flexible touch-sensitive display portion is attached to a second structural support segment;
      (3) the flexible touch-sensitive display further comprises having a fully folded state;
      (4) the flexible touch-sensitive display further comprises having a partially expanded state;
      (5) the flexible touch-sensitive display further comprises having a fully expanded state;
   (b) an electromechanical slip ring assembly electronically connecting the first and second flexible touch-sensitive display structural support segments utilizing two rings that each have separate center points and conductive material such that the conductive material of each of the two rings are continuously in contact with each other as the apparatus is folded.

2. The apparatus of claim 1 wherein:
a plurality of electromechanical slip rings is included to provide a plurality of electronic connections.

3. The apparatus of claim 1 wherein:
at least one of the rings of the electromechanical slip ring assembly is mechanically connected to at least one structural support segment.

4. The apparatus of claim 1 wherein:
the first structural support segment and the second structural support segment are connected by a hinge and a sleeve structure that houses the hinge.

5. The apparatus of claim 4 wherein:
at least one of the rings of the electromechanical slip ring assembly is mechanically connected to a spur gear and the spur gear is mechanically connected to at least one structural support segment; and the electromechanical slip ring and spur gear are supported by the hinge sleeve structure.

6. The apparatus of claim 1 wherein:
the two rings of the electromechanical slip ring assembly are electronically connected to each other through their outside edges.

7. The apparatus of claim 1 wherein:
the two rings of the electromechanical slip ring assembly are electronically connected to each other through their side faces.

8. The apparatus of claim 1 wherein:
the two rings of the electromechanical slip ring assembly are electronically connected to each other through a conductive pin whereby the conductive pin sits within conductive slots located within each of the two rings.

9. The apparatus of claim 1 wherein:
the two rings of the electromechanical slip ring assembly are electronically connected to each other through a conductive pin which sits within a conductive slot whereby the conductive pin is attached to one ring and the slot is situated within the other ring.

10. The apparatus of claim 1 wherein:
the two rings of the electromechanical slip ring assembly are electronically connected to each other through a conductive pin whereby the conductive pin is attached to at least one ring.

11. An apparatus comprising:
(a) a flexible touch-sensitive display composed of a first flexible touch-sensitive display portion and a second flexible touch-sensitive display portion; wherein:
  (1) the first flexible touch-sensitive display portion is attached to a first structural support segment;
  (2) the second flexible touch-sensitive display portion is attached to a second structural support segment;
  (3) the flexible touch-sensitive display further comprises having a fully folded state;
  (4) the flexible touch-sensitive display further comprises having a partially expanded state;
  (5) the flexible touch-sensitive display further comprises having a fully expanded state;
(b) an electromechanical slip ring assembly electronically connecting the first and second flexible touch-sensitive display structural support segments utilizing two rings that each have conductive material and share the same center point such that the conductive material of each of the two rings are continuously in contact with each other as the apparatus is folded.

12. The apparatus of claim 10 wherein:
a plurality of electromechanical slip rings is included to provide a plurality electronic connections.

13. The apparatus of claim 10 wherein:
at least one of the rings of the electromechanical slip ring assembly is mechanically connected to at least one structural support segment.

14. The apparatus of claim 10 wherein:
the first structural support segment and the second structural support segment are connected by a hinge and a sleeve structure that houses the hinge.

15. The apparatus of claim 14 wherein:
at least one of the rings of the electromechanical slip ring assembly is mechanically connected to a spur gear and the spur gear is mechanically connected to at least one structural support segment; and the electromechanical slip ring and spur gear are supported by the hinge sleeve structure.

16. The apparatus of claim 10 wherein:
the two rings of the electromechanical slip ring assembly are electronically connected to each other through their outside edges.

17. The apparatus of claim 10 wherein:
the two rings of the electromechanical slip ring assembly are electronically connected to each other through their side faces.

18. The apparatus of claim 10 wherein:
the two rings of the electromechanical slip ring assembly are electronically connected to each other through a conductive pin whereby the conductive pin sits within conductive slots located within each of the two rings.

19. The apparatus of claim 10 wherein:
the two rings of the electromechanical slip ring assembly are electronically connected to each other through a conductive pin which sits within a conductive slot whereby the conductive pin is attached to one ring and the slot is situated within the other ring.

20. The apparatus of claim 10 wherein:
the two rings of the electromechanical slip ring assembly are electronically connected to each other through a conductive pin whereby the conductive pin is attached to at least one ring.

* * * * *